(12) United States Patent
Suzuki

(10) Patent No.: US 7,785,980 B2
(45) Date of Patent: Aug. 31, 2010

(54) METHOD OF MANUFACTURING SEMICONDUCTOR DEVICE USING ALIGNMENT MARK AND MARK HOLE

(75) Inventor: Kazushi Suzuki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 454 days.

(21) Appl. No.: 11/798,523

(22) Filed: May 15, 2007

(65) Prior Publication Data

US 2007/0275520 A1    Nov. 29, 2007

(30) Foreign Application Priority Data

May 25, 2006   (JP)   ............... 2006-145330

(51) Int. Cl.
    *H01L 21/30*   (2006.01)
(52) U.S. Cl. ............ 438/401; 438/462; 257/283; 257/340; 257/797; 257/E23.001; 257/E23.179
(58) Field of Classification Search ........... 438/401, 438/462; 257/283, 340, 797, E23.001, E23.179
    See application file for complete search history.

(56) References Cited

U.S. PATENT DOCUMENTS 4,589,928 A  *  5/1986  Dalton et al. ............... 438/143
4,837,176 A  *  6/1989  Zdebel et al. ............... 438/552
6,376,924 B1    4/2002  Tomita et al.
6,756,691 B2    6/2004  Tomita et al.

FOREIGN PATENT DOCUMENTS

JP    2001-036036 A    9/2001

\* cited by examiner

*Primary Examiner*—Thanh V Pham
(74) *Attorney, Agent, or Firm*—Foley & Lardner LLP

(57) ABSTRACT

An object of the present inventions is to overcome a problem that the presence of a metal film, which is opaque to a visible light, between a lower layer alignment mark and a photoresist prevents the detection of the lower layer alignment mark, to make the pattern formation difficult. In the present inventions, an insulating film is placed beneath the alignment mark in structure; an alignment mark consisting of said multi-layered film comprising an alignment mark layer and the insulating film, which constitutes a stepped part with an increased difference in level, is first formed, inside a mark hole, in a manner of self-alignment; and then the metal film which is the very cause of the above problem is formed thereon. Since the metal film itself has a stepped shape corresponding to the alignment mark, alignment can be made with great accuracy.

3 Claims, 5 Drawing Sheets

METHOD OF MANUFACTURING SEMICONDUCTOR DEVICE USING ALIGNMENT MARK AND MARK HOLE

BACKGROUND OF THE INVENTION

1. Field of the Invention

The present invention relates to a method of manufacturing a semiconductor device and more particularly to a method of forming an alignment mark used in lithography, which provides the alignment mark possible to be detected even when a metal film or the like, which is opaque to a visible light, is present between a photoresist and a lower layer pattern.

2. Description of the Prior Art

The semiconductor device formed on the semiconductor substrate is, in general, made by repeated steps of forming an interconnection in a multi-layered layer, forming a contact plug to connect an upper interconnection with a lower interconnection, and the like. For instance, in order to connect a lower layer interconnection with an upper layer interconnection which is formed above the lower layer interconnection through an insulating film, the following steps may be taken.

Firstly, after a layer for the lower layer interconnection is formed, a lower layer interconnection pattern made of a photoresist is formed by means of lithography on the layer for the lower layer interconnection. Next, using this photoresist as a mask, the layer for the lower layer interconnection is worked upon and then the remaining photoresist is removed to form the lower layer interconnection. Next, an insulating film is formed over the entire surface, and again by means of lithography, a contact hole pattern made of a photoresist is formed on the insulating film. The contact hole pattern is formed so that the contact hole pattern is located and aligned over the lower layer interconnection. Next, using this photoresist as a mask, the insulating film is worked upon and then the remaining photoresist is removed to form the contact hole. The contact hole is subsequently filled with a conductive substance, and thereby a contact plug is formed. Next, a layer for the upper layer interconnection is formed over the entire surface, and again by means of lithography, an upper layer interconnection pattern made of a photoresist is formed thereon. The upper layer interconnection pattern is formed so that the upper layer interconnection pattern is located and aligned over the contact plug. Next, using this photoresist as a mask, the layer for the upper layer interconnection is worked upon and then the photoresist is removed to form the upper layer interconnection. In the result, the upper layer interconnection is connected to the lower layer interconnection through the contact plug.

In a series of the steps described above, the lower layer interconnection and the contact plug as well as the contact plug and the upper layer interconnection must be aligned so that their respective contact faces may be off each other. To conduct these alignments, alignment marks for achieving required superimpositions are formed both on the reticles (the masks for exposure) on which a circuit pattern is formed and on the semiconductor substrate. While the alignment mark on the reticle is formed, in advance, at the time of reticle formation, the alignment mark on the semiconductor substrate is formed in a region other than an element formation region, as the manufacturing steps proceed.

In recent years, demands for further miniaturization and higher performance for the semiconductor device have led to frequent application of the planarization onto the surface by means of the CMP (Chemical Mechanical Polishing), the extensive use of non-transmissive metal materials for the interconnection and the employment of a thinner film for the mark layer to constitute the alignment mark. These factors have made the detection of the alignment mark formed on the semiconductor substrate difficult.

One example of such a case that the detection of the alignment mark is made difficult as mentioned above is described in details below, with reference to a cross-sectional view of a structure of a memory cell section of a DRAM (Dynamic Random Access Memory) shown in FIG. 1.

In a prescribed region of a semiconductor substrate 1, there are formed an element isolation regions 2 as well as a source 9 and a drain 10, each of the source 9 and the drain 10 is made of a dopant diffusion layer. On the semiconductor substrate 1, a gate insulating film 3 is formed, and thereon a word line is formed which consists of a first silicon film 4 made of polycrystalline silicon, a metal film 5 made of tungsten or the like, a silicon nitride film 6, a silicon oxide film 7 and sidewall insulating films 8. After the word line is formed, a second silicon film is formed over the entire surface, and contact plugs 12 and 13 are formed, which respectively connect with the source 9 and the drain 10. A first interlayer insulating film 11 is then formed over the entire surface, and the planarization by the CMP method is applied thereto so as to expose the top surfaces of the contact plugs 12 and 13. Next, a second interlayer insulating film 14 is formed and a bit line contact hole 25 is made through the second interlayer insulating film 14 so as to reach the contact plug 13. Next, a bit line contact plug is formed by filling up the bit line contact hole 25 with a titanium nitride film 15 and a tungsten film 16. Following that, a bit line 17 made of a tungsten film or the like is formed so as to connect with the bit line contact plug. Then, a third interlayer insulating film 18 is formed, and a capacitor contact plug 19 is formed to run through the interlayer insulating films 14 and 18 and to be connected with the contact plug 12. Subsequently, a fourth interlayer insulating film 20 is formed and a deep hole to expose the top surface of the capacitor contact plug 19 is formed. By these formations, a capacitor consisting of a lower electrode 21, a dielectric 22 and an upper electrode 23 is formed, and thereby a memory cell of a DRAM is formed.

In the aforementioned DRAM memory cell, if the spacing of the word lines is sufficiently provided, the bit line 17 can be directly connected with the semiconductor substrate and, therefore, the alignment mark used in lithography at the time of formation of the bit line 17 may be made of the word line, as described in Japanese Patent Application Laid-open No. 2001-36036. On the other hand, when the spacing of the word lines becomes too narrow, it is difficult that the bit line 17 is directly connected with the semiconductor substrate and the connection of the bit line must be made indirectly through a contacting face that is raised to the level of an upper layer through the use of a contact plug, as shown in FIG. 1. The requirement for high standard alignment in such a case necessitates an alignment mark to be formed on the same layer as the contact plug at the time of the bit line formation.

A method of forming a bit line, in which the aforementioned alignment mark formed on the same layer as the contact plug is used, is described below.

FIG. 2 shows one example of a planar pattern for an alignment mark which is to be formed on the same layer as a contact plug. Inside the alignment mark section 102 with a width L of 180 µm, there are disposed nine rectangular alignment marks 101. The width A of the rectangular alignment marks is 6 µm, the interval B therebetween is also 6 µm and the length C thereof is 45 µm. In respect that the widths of both of the foregoing word line and bit line are 0.1 µm or so, it is evident that the alignment mark section occupies a substantially large area.

FIG. 3 shows a cross-sectional view of a structure of an alignment mark section at the stage where the bit line 17 is formed in the memory cell section in the DRAM of FIG. 1. When the formation of the bit line has been completed in the memory cell section of FIG. 1, a gate insulating film 3, a first silicon film 4, a metal film 5, a silicon nitride film 6 and a silicon oxide film 7 have been laminated on the semiconductor substrate 1 in the alignment mark section. Then, a silicon film is formed also in the alignment mark section at the same layer as the silicon film for forming the contact plug in the memory cell section. After that, while contact plugs 12 and 13 are formed by means of lithography and dry etching in the memory cell section, the silicon film in the alignment mark section is also worked upon, concurrently, with the alignment mark pattern shown in FIG. 2 being used, to form an alignment mark 13b. The alignment mark is herein presented as a single bar for convenience.

Next, an interlayer insulating film 11 is formed over the entire surface, and the planarization by the CMP method is applied to the surface thereof so as to expose the top surfaces of the contact plugs 12 and 13 in the memory cell section shown in FIG. 1 as well as that of alignment mark 13b in the alignment mark section shown in FIG. 3. Next, an interlayer insulating film 14 is formed and a bit line contact hole 25 is formed in the memory cell section. For the formation of the bit line contact hole 25, the alignment mark 13b is utilized. Next, by filling up the bit line contact hole 25 with a titanium nitride film 15 and a tungsten film 16, a bit line contact plug is formed. After that, a bit line layer made of a tungsten film or the like is formed, and then a bit line 17 is formed by means of lithography and dry etching.

SUMMARY OF THE INVENTION

In the conventional methods described above, the bit line contact hole 25 which is formed in the memory cell section of FIG. 1 can be formed and aligned with the pattern of the contact plug 13, using the alignment mark 13b formed in the alignment mark section of FIG. 3. Although the interlayer insulating film 14 whose surface is planarized covers the alignment mark 13b in the alignment mark section shown in FIG. 3, the interlayer insulating film is transmissive to the visible light used for the alignment mark detection so that the alignment mark can be detected through the change in contrast of the reflected light caused by a difference in level that the alignment mark 13b itself forms.

However, once a bit line layer made of a metal film such as a tungsten film is formed on the planarized surface of the interlayer insulating film 14, the detection of the alignment mark which is placed under the bit line layer becomes difficult, since the metal constituting the bit line layer is opaque to the visible light used for the alignment mark detection. Therefore, the bit line 17 can not be aligned with the contact plug 13 during the formation, causing a misalignment of the pattern and giving rise to a problem that circuits may not be fabricated as designed.

As described above, when the alignment mark is made with the contact plug layer which is formed at a higher level than the word line, and a pattern is formed at an even higher level using this alignment mark, the presence of a film of metal or the like, which is opaque to the visible light, between the alignment mark and the upper layer photoresist makes the alignment mark detection difficult, and brings about serious problems in alignment between the upper layer and the lower layer and consequently in circuit construction.

In light of the above problems, an object of the present invention is to provide a method of manufacturing a semiconductor device in which a circuit is constructed by a method of forming an alignment mark which enables to make good alignment between the upper layer and the lower layer, regardless of the presence of a film of metal or the like, which is opaque to the visible light, between the alignment mark and the upper layer photoresist.

To overcome the above problem, the present invention relates to a method of manufacturing a semiconductor device, which comprises the steps of:

forming, on a semiconductor substrate, a first interconnection comprising a gate electrode with a metal layer on a top face thereof and an insulating film on said metal layer;

forming, in an interval of said first interconnection, a contact plug made of a conductor;

forming, over the entire surface, an interlayer insulating film;

forming a metal plug which runs through said interlayer insulating film and connects with said contact plug; and forming a metal interconnection on said metal plug; wherein said metal interconnection is formed so as to align with a position of said contact plug; and an alignment mark that is to be used in lithography for aligning said metal interconnection with said contact plugs is formed, on the bottom face inside a mark hole which is formed in said interlayer insulating film, of a multi-layered film which comprises said conductor to constitute said contact plug and said insulating film formed on said gate electrode.

Further, in the present invention, said alignment mark consisting of said multi-layered film comprising said conductor and said insulating film is formed, in the step of forming said mark hole, in a manner of self-alignment to a pattern of said conductor.

Furthermore, the present invention relates to a method of manufacturing a semiconductor device, which comprises the steps of:

(1) forming, on a semiconductor substrate, a gate insulating film, a first silicon film, a first metal layer and an insulating film, in succession;

(2) forming, on said insulating film, a plurality of rectangular patterns consisting of a second silicon film;

(3) forming, over the entire surface, an interlayer insulating film and then planarizing a surface of said formed interlayer insulating film;

(4) forming a mark hole in said interlayer insulating film, to expose a plurality of said rectangular patterns consisting of said second silicon film on the bottom face inside said mark hole;

(5) removing an exposed portion of said insulating film on the bottom face of said mark hole, with said second silicon film which is exposed in the form of rectangular patterns being used as a mask, to form an alignment mark consisting of said insulating film and said second silicon film;

(6) forming, over the entire surface, a metal interconnection layer; and (7) forming, over the entire surface, a photoresist and then forming, on said metal interconnection layer, an interconnection pattern made of said photoresist on said metal interconnection layer with said alignment mark consisting of said insulating film and said second silicon film being used as a mask.

As set forth above, in the method of manufacturing the semiconductor device according to the present invention, after the alignment mark layer made of the conductive substance is covered with the interlayer insulating film, the mark hole is formed in the interlayer insulating film laid in the alignment mark section, so as to expose the alignment mark layer. Further, in forming the mark hole, the insulating film laid under the alignment mark layer is together worked upon in the manner of self-alignment, providing, beforehand, a difference in level for the alignment mark, which is to be formed consisting of a multi-layered film comprising the insulating film and the conductive substance layer. Subsequently, the bit line layer is formed of metal or the like. The metal is reflected in the difference in level, which is to be formed consisting of a multi-layered film comprising the insulating film and the conductive substance layer so that the resulting structure becomes equivalent to the one that the metal itself has the difference in level. Therefore, the difference in level made of metal appears on the surface and the mark detection light has the contrast induced by the difference in level made of metal. To be short, the present invention has the effect that the alignment of the upper layer pattern with the lower layer pattern becomes possible, regardless of the presence of metal, which is opaque to the visible light, between the lower layer alignment mark and the upper layer photoresist.

DETAILED DESCRIPTION OF PREFERRED EMBODIMENTS

Figure 1:
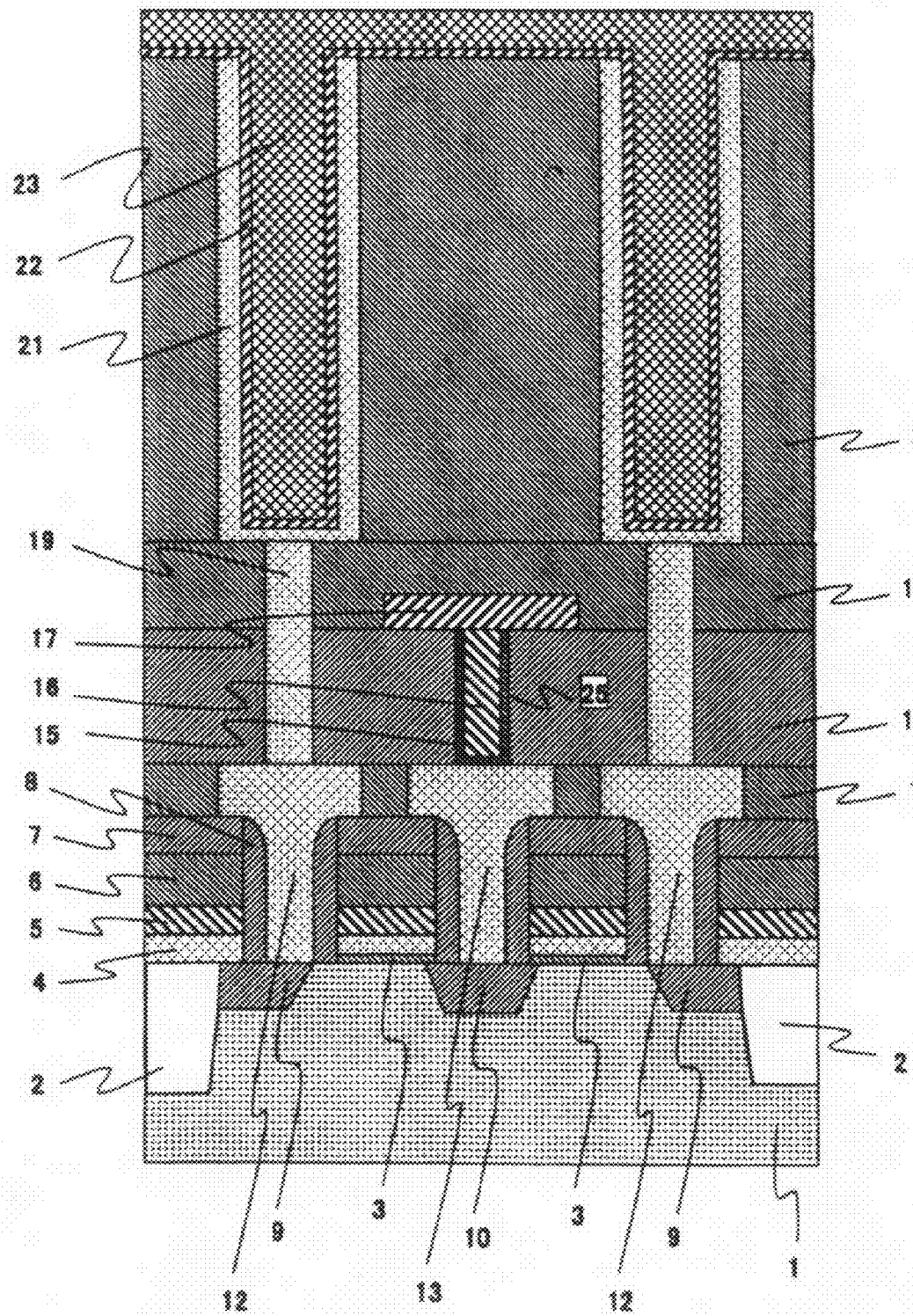
FIG. 1 is a schematic cross-sectional view showing one example of a structure of a memory cell section of a DRAM.
Figure 2:
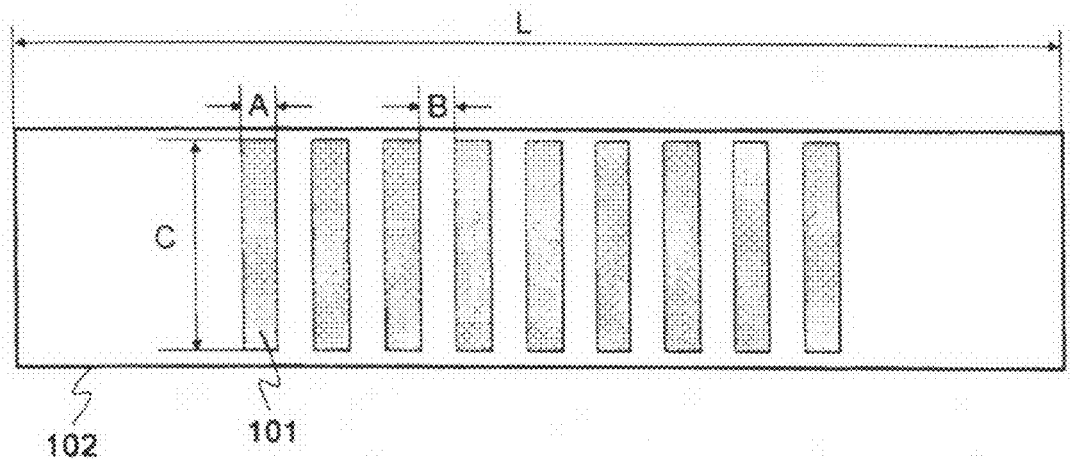
FIG. 2 is a schematic plan view showing one example of the alignment mark pattern.

An example of the present invention is described in details below, referring to FIGS. 4A to 4G and FIG. 5. FIGS. 4A to 4G show cross-sectional structures of a memory cell section illustrated in FIG. 1 and the alignment mark section formed in a region other than the element formation region in contrast with each other. Further, while the alignment mark employed in the alignment mark section hereat had the same pattern as shown in FIG. 2, it is, for convenience, presented as a single bar in FIG. 4.

Example

Figure 4A:
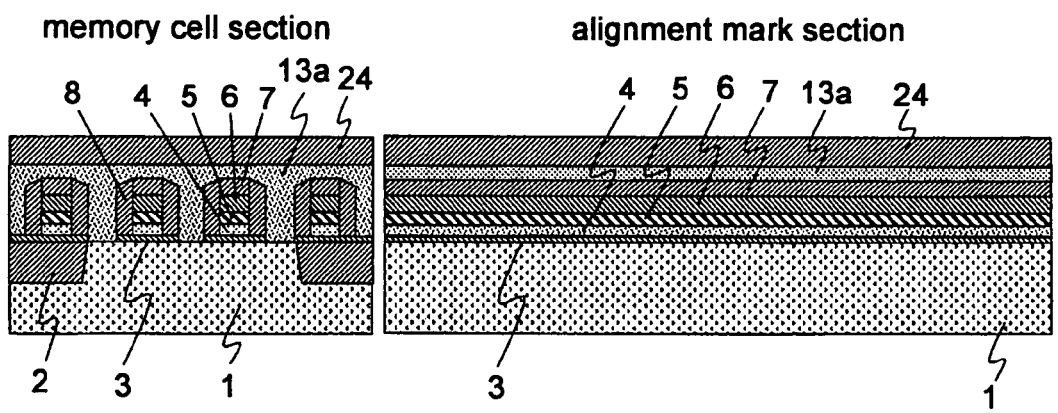
FIGS. 4A to 4G are schematic cross-sectional views for explaining the steps for a method of manufacturing an alignment mark in the present inventions.

Firstly, as shown in the memory cell section of FIG. 4A, an element isolation region 2 was formed by a well-known method in prescribed region of a surface of a semiconductor substrate 1 which was made of p-type single-crystal silicon, and then a gate insulating film 3 with a thickness of 4 nm was formed by a thermal oxidation method on the surface of the semiconductor substrate. After that, a first silicon film 4 was grown by a well-known CVD (Chemical Vapor Deposition) method with monosilane ($SiH_4$) being used as a source gas. The thickness of the first silicon film 4 was set to be 70 nm. Next, a metal film 5 was grown to a thickness of 90 nm by a well-known sputtering method, and, further, a silicon nitride film 6 were grown to a thickness of 120 nm by a well-known plasma CVD method with monosilane and ammonia ($NH_4$) being used as source gases, and a silicon oxide film 7 were grown to a thickness of 80 nm by a well-known plasma CVD method with monosilane and dinitrogen monoxide ($N_2O$) being used as source gases. Next, by means of lithography and dry etching, the silicon oxide film 7, the silicon nitride film 6, the metal film 5 and the first silicon film 4 were worked upon. Further, a silicon nitride film was grown to a thickness of 30 nm over the entire surface, and applying an etch back thereto, a sidewall insulating film 8 consisting of a silicon nitride film was formed and thereby a word line was formed. Though not shown in the drawings, a dopant diffusion layer such as a source and a drain may be formed, by the ion implantation method, on the surface of the semiconductor substrate either before or after the formation of the sidewall insulating film 8.

After forming the word line, a second silicon film 13a was grown to a thickness of 80 nm over the entire surface, and then a silicon oxide film 24 was grown to a thickness of 120 nm. At this stage, in the alignment mark section, layers of the gate insulating film 3, the first silicon film 4, the metal film 5, the silicon nitride film 6, the silicon oxide film 7, the second silicon film 13a and the silicon oxide film 24 were lying, in this order, on the semiconductor substrate 1.

Figure 4B:
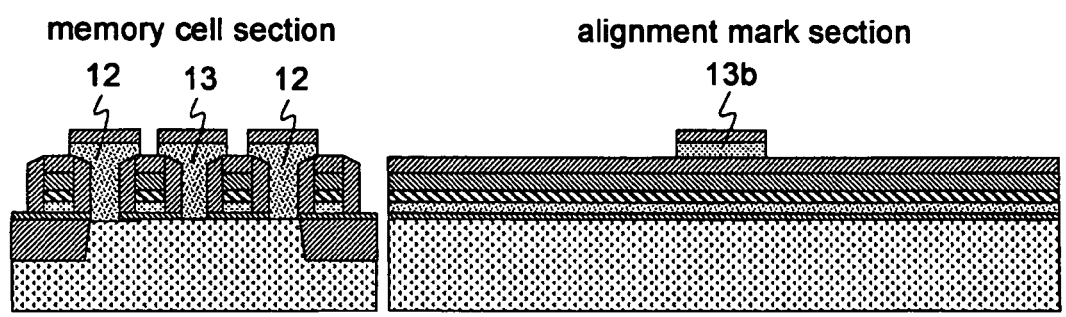

Next, as shown in the memory cell section of FIG. 4B, the silicon oxide film 24 and the second silicon film 13a were worked upon by means of lithography and dry etching to form contact plugs 12 and 13. In order to form the contact plugs 12 and 13, the silicon oxide film 24 was first etched, using a photoresist pattern formed by lithography as a mask, and then the second silicon film 13a was etched, using this silicon oxide film 24 as a mask, a gas plasma of trifluoromethane ($CHF_3$) was used for the etching of the silicon oxide film 24, and a gas plasma of hydrogen bromide (HBr) was used for the etching of the second silicon film 13a. At this stage, in the alignment mark section, an alignment mark layer 13b consisting of the second silicon film was formed.

Figure 4C:
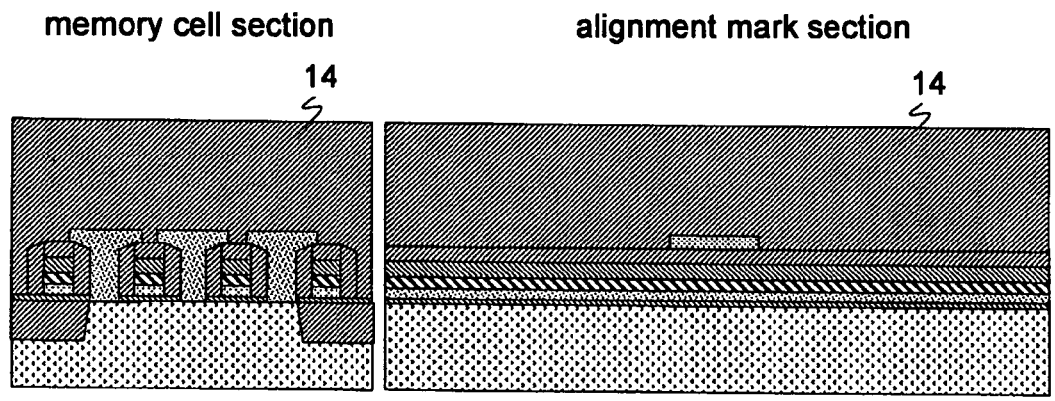

Next, as shown in FIG. 4C, an interlayer insulating film 14 consisting of a silicon oxide film deposited by a HDP (High Density Plasma) method was formed over the entire surface, and then the planarization by the CMP method was applied to its surface. The thickness of the interlayer insulating film 14 was set to be 500 nm. Further, the interlayer insulating film can consist of a layered film comprising the silicon oxide film grown by the HDP method and a silicon oxide film grown by a plasma CVD method.

Figure 4D:
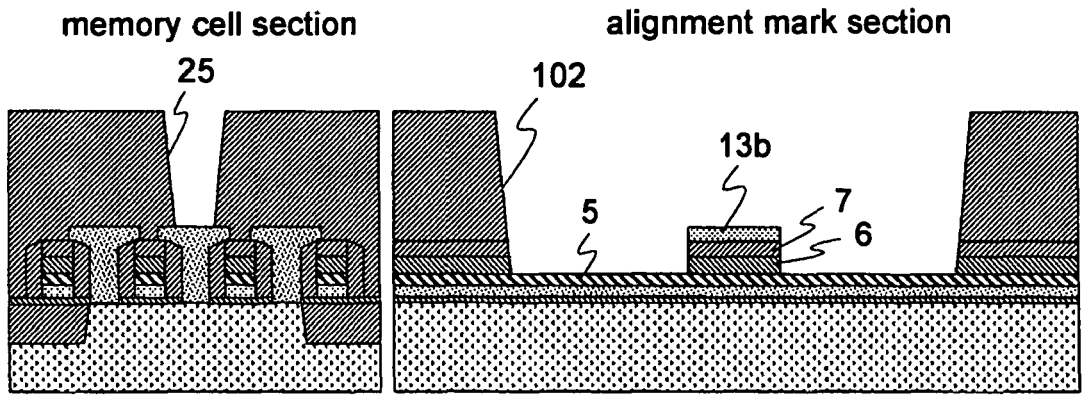

Next, as shown in FIG. 4D, the interlayer insulating film 14 was worked upon by means of lithography and dry etching to form a bit line contact hole 25 in the memory cell section and to form a mark hole 102 in the alignment mark section. As mentioned previously, the alignment mark layer 13b was, at this stage, covered only with the interlayer insulating film 14 that is transmissive to the visible light, so that the alignment mark layer 13b could be used as an alignment mark for forming the bit line contact hole 27.

Further, the mark hole 102 was formed by dry etching, using a gas plasma containing octafluorocyclopentane ($C_5F_8$), trifluoromethane, oxygen and argon. Since the gas plasma allows selective etching of a silicon oxide film over a silicon film, it was possible to leave the alignment mark layer 13b, even if the interlayer insulating film 14 was etched to expose the alignment mark layer 13b on the bottom of the mark hole 102 in the alignment mark section. Further, in the present invention, since the structure was such that the insulating film consisting of the silicon oxide film 7 and the silicon nitride film 6 lay immediately under the alignment mark layer 13b, the lower layers of the silicon oxide film 7 and the silicon nitride film 6 could be etched in the manner of self-alignment, using the alignment mark layer 13b as a mask during the formation of the mark hole 102. Moreover, since a metal film made of tungsten or the like could be hardly etched with the foregoing gas plasma, the etching automatically stopped when the metal film 5 was exposed. Accordingly, inside the mark hole 102, an alignment mark consisting of a multi-layered film comprising the silicon nitride film, the silicon oxide film and the alignment mark layer 13b was formed, which had a stepped part with an increased difference.

Figure 4E:
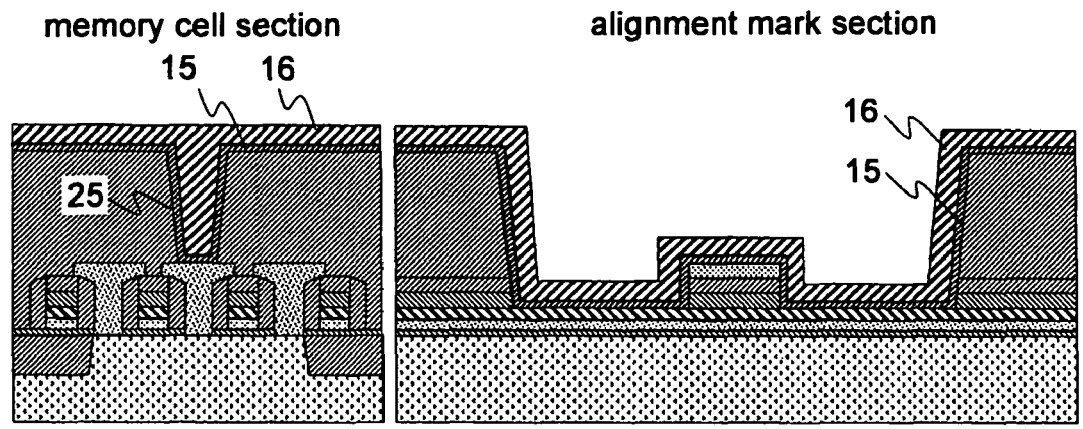

Next, as shown in FIG. 4E, a titanium nitride film 15 and a tungsten film 16 were successively grown to a thickness of 25 nm and 200 nm, respectively, so as to fill up the bit line contact hole 25 in the memory cell section. The titanium nitride film was formed by the CVD method with titanium tetrachloride ($TiCl_4$) and ammonia being used as source gases, and besides, prior to the formation of the titanium nitride film, a titanium silicide had been deposited on the surface of the contact plug 13 (not shown in the drawings) by depositing titanium with titanium tetrachloride being used as a sole source gas, at an initial stage for formation of layer. Further, since the mark hole 102 in the alignment mark section occupied a large area, the mark hole could not be filled up with the tungsten film with such a thickness as mentioned above and thereby the titanium nitride film 15 and the tungsten film 16 were formed inside and outside the mark hole 102, accordingly. In this case, a stepped part of the alignment mark was maintained.

Figure 4F:
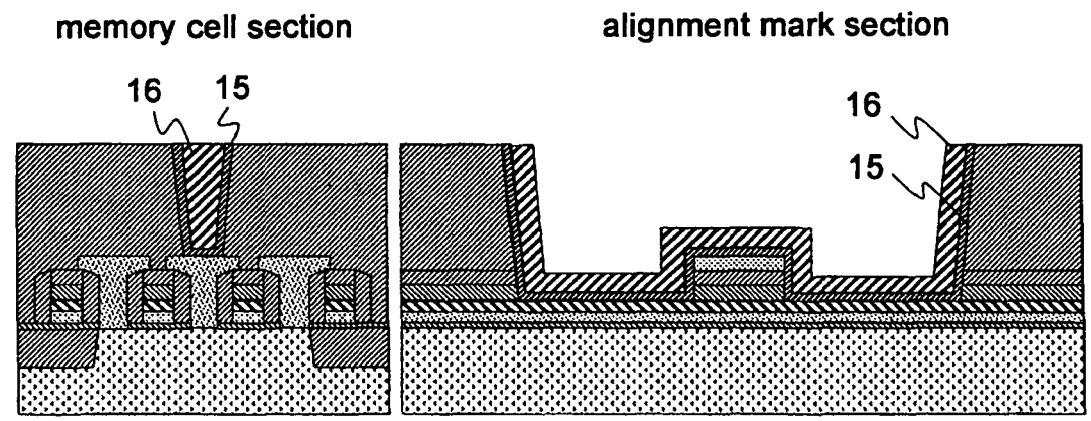

Next, as shown in FIG. 4F, portions of the tungsten film 16 and the titanium nitride film 15 lying on the interlayer insulating film 14 were removed by the CMP by the CMP method to form a bit line contact plug in the memory cell section.

Figure 4G:
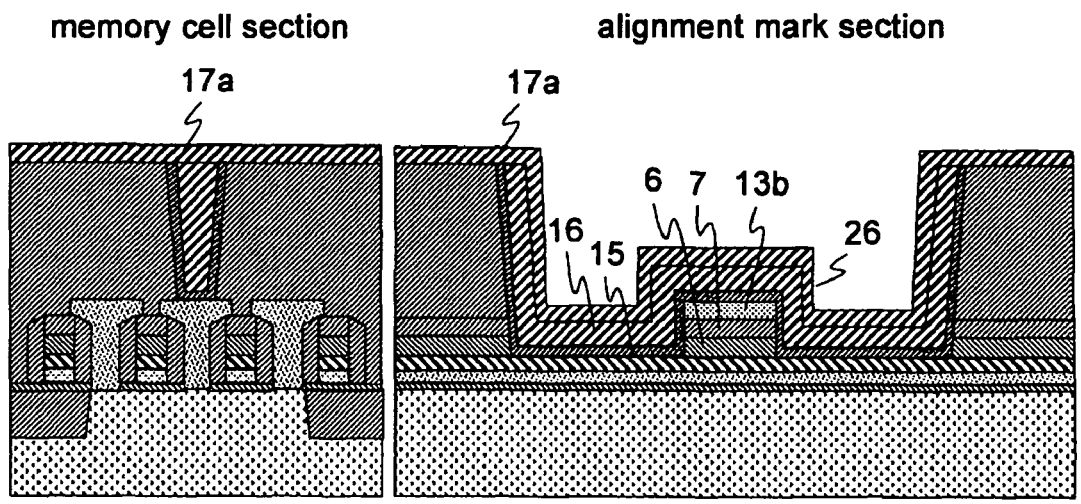

Next, as shown in FIG. 4G, a metal film 17a made of tungsten was grown to a thickness of 70 nm over the entire surface and the metal film 17a was etched by mean of lithography and dry etching to form a bit line 17.

In the present example, when the metal film 17a is formed over the entire surface, the alignment mark in the alignment mark section is covered with the titanium nitride film 15, the tungsten film 16 and the metal film 17a, all of which is opaque to the visible light, so that the presence of the alignment mark layer 13b can not be detected from above. Nevertheless, since the alignment mark is constituted with the stepped part created by the multi-layered film comprising the silicon nitride film 6, the silicon oxide film 7 and the alignment mark layer 13b, the stepped part 26 can be maintained when the metal film 17a was formed thereon, and thereby the alignment of a photoresist pattern in lithography can be made by using the contrast of the detection light induced by the stepped part 26. That is to say, by forming a photoresist with an anti-reflection coating film after depositing the metal film 17a, and detecting the contrast of the detection light induced by the stepped part 26 of the foregoing alignment mark, a bit line pattern from the photoresist can be formed with an alignment of the position with the lower contact plug 13. Because the bit line contact plug was aligned with the contact plug 13, the bit line pattern was formed with an alignment with the bit line contact plug as a result.

Figure 3:
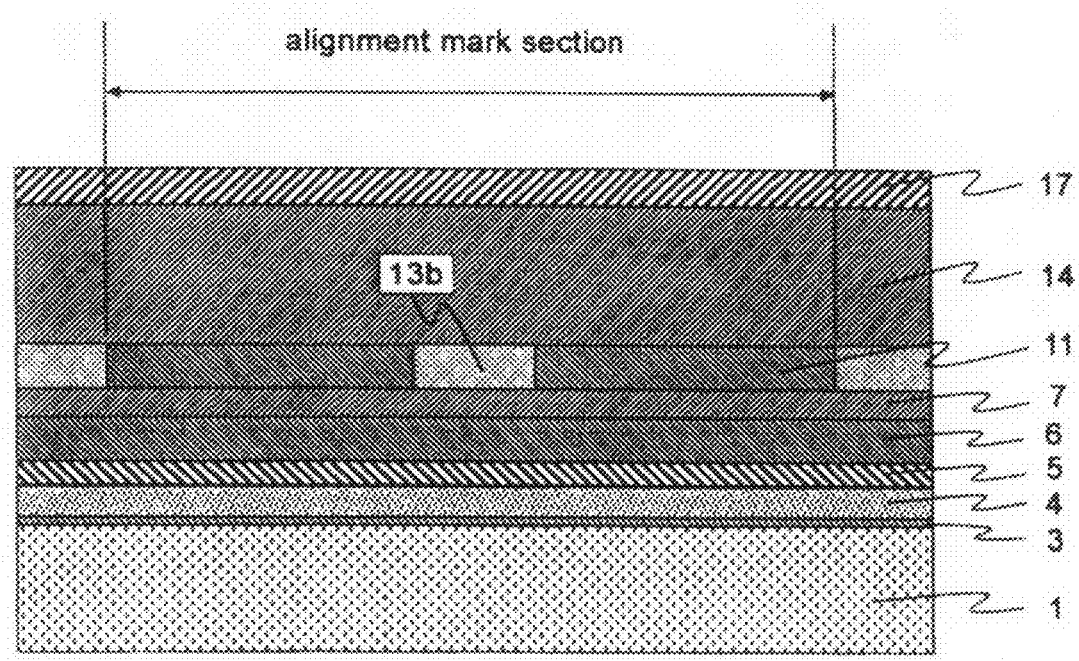
FIG. 3 is a schematic cross-sectional view for explaining problems of the conventional alignment mark.
Figure 5:
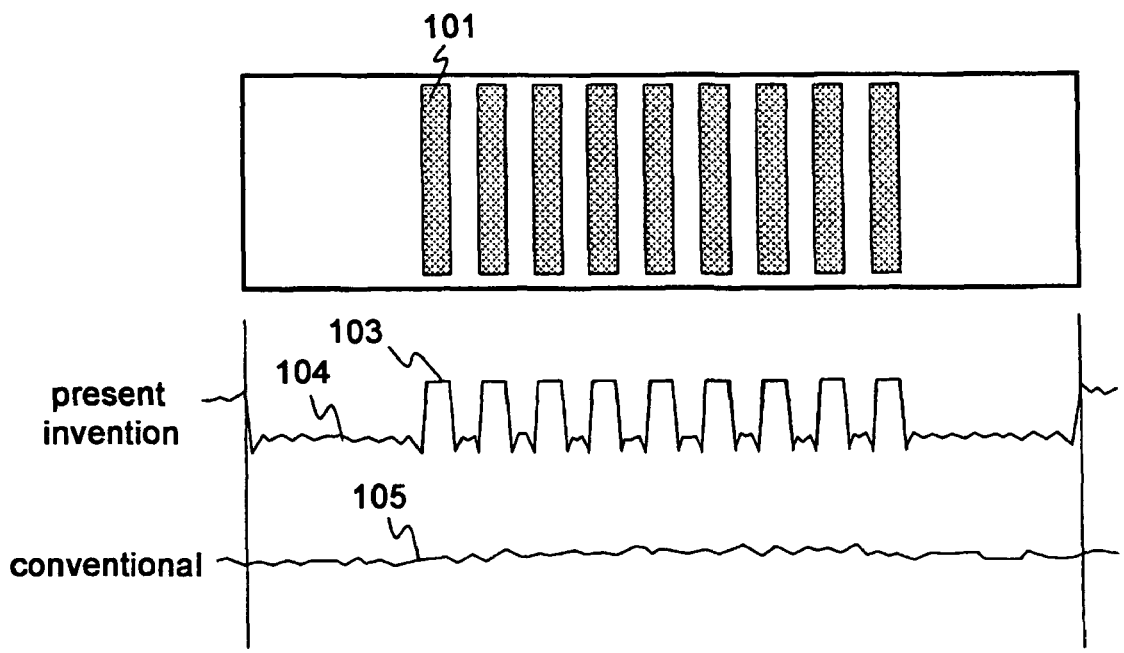
FIG. 5 is a set of diagrams showing the detection light contrasts for explaining the effects of the alignment mark in the present invention.

FIG. 5 shows a set of schematic contrasts of a detection light for detecting an alignment mark when the alignment mark of the present invention formed by the manufacturing method of the present example is used and when the alignment mark formed by the conventional method shown in FIG. 3 is used. In the case of the alignment mark formed by the conventional method, the contrast 105 of the detection light is more or less flat to hardly distinguish the position of the alignment mark. Compared with this, in the case of the alignment mark of the present invention, the clear contrasts 103 and 104 of the detection light corresponding to the alignment mark 101 are obtained to be able to align the position accurately.

What is claimed is:

1. A method of manufacturing a semiconductor device, the method comprising:
    forming a first metal interconnection layer and an insulating film in succession on a semiconductor substrate;
    forming a rectangular pattern to be used as an alignment mark on said insulating film;
    forming an interlayer insulating film over the entire surface;
    forming a mark hole in said interlayer insulating film to expose top and side surfaces of said rectangular pattern;
    after the forming the mark hole, removing said insulating film by using the rectangular pattern as a mask to expose a surface of said first metal interconnection layer;
    forming a second metal interconnection layer over the entire surface; and
    forming an etching mask pattern on said second metal interconnection layer by using said rectangular pattern and said insulating film formed thereunder as the alignment mark.

2. The method of manufacturing a semiconductor device according to claim 1, further comprising:
    planarizing said interlayer insulating film to produce a planarized interlayer insulating film before forming the mark hole in the interlayer insulating film, the mark hole being formed in the planarized interlayer insulating film.

3. The method of manufacturing a semiconductor device according to claim 1, wherein said etching mask pattern comprises a photoresist pattern.

* * * * *